(12) United States Patent
Chung et al.

(10) Patent No.: US 8,049,115 B2
(45) Date of Patent: Nov. 1, 2011

(54) PRINTED CIRCUIT BOARD AND LIGHT SENSING DEVICE USING THE SAME

(75) Inventors: Jung-Kuei Chung, Taipei Hsien (TW); Chi-Hsiung Lee, Taipei Hsien (TW); Tsung-Liang Hung, Taipei Hsien (TW)

(73) Assignee: Hon Hai Precision Co., Ltd., Tu-Cheng, New Taipei (TW)

( * ) Notice: Subject to any disclaimer, the term of this patent is extended or adjusted under 35 U.S.C. 154(b) by 984 days.

(21) Appl. No.: 11/960,709

(22) Filed: Dec. 20, 2007

(65) Prior Publication Data

US 2008/0149367 A1    Jun. 26, 2008

(30) Foreign Application Priority Data

Dec. 22, 2006    (CN) .......................... 2006 1 0157883

(51) Int. Cl.
    *H05K 1/16*    (2006.01)
(52) U.S. Cl. ........................ 174/260; 174/261
(58) Field of Classification Search .................. 174/255, 174/260–262, 520, 521
    See application file for complete search history.

(56) References Cited

U.S. PATENT DOCUMENTS

| 6,396,116 | B1 * | 5/2002 | Kelly et al. ................... 257/432 |
| 6,720,666 | B2 * | 4/2004 | Lim et al. ..................... 257/786 |
| 6,825,551 | B1 * | 11/2004 | Do Bento Vieira ........... 257/678 |
| 6,833,612 | B2 * | 12/2004 | Kinsman ........................ 257/680 |
| 2003/0040145 | A1 * | 2/2003 | Borghs et al. ................. 438/165 |
| 2006/0231750 | A1 * | 10/2006 | Chao et al. .................... 250/239 |
| 2009/0139759 | A1 * | 6/2009 | Ueda et al. .................... 174/262 |

FOREIGN PATENT DOCUMENTS

| CN | 1601739 A | 3/2005 |
| TW | I252068 | 3/2006 |
| TW | 200644608 | 12/2006 |

* cited by examiner

*Primary Examiner* — Ishwarbhai Patel
(74) *Attorney, Agent, or Firm* — Altis Law Group, Inc.

(57) ABSTRACT

A printed circuit board (PCB) adapted for mounting different kinds of light sensing modules thereon includes a lighting sensing area and a plurality of pads. The pads are disposed around the lighting sensing area, for configuring one light sensing module thereon. In the present invention, the PCB is suitable for different kinds of light sensing modules without redesign, which lowers the manufacturing cost of the PCB.

8 Claims, 8 Drawing Sheets

PRINTED CIRCUIT BOARD AND LIGHT SENSING DEVICE USING THE SAME

BACKGROUND OF THE INVENTION

1. Field of the Invention

The invention relates to printed circuit boards, and particularly to a printed circuit board and a light sensing device using the same.

2. Description of Related Art

Nowadays, liquid crystal display (LCD) panels are widely in devices, such as notebook computers or laptop computers. Generally, LCD panels use discharge lamps or other lamps of backlight modules as light sources, and employ a light sensor to sense ambient light to dynamically adjust the brightness of the LCD panel, consequently lowering power consumption of the backlight modules.

Normally, light sensors manufactured by various sensor suppliers are structurally different. Backlight module manufacturers have to design different PCB layouts to accommodate various light sensors, which complicates the PCB layouts. Especially, if one sensor supplier cannot provide light sensors to the backlight module manufacturer on time, the backlight module manufacturer should then redesign its PCB layout to fit another light sensor provided by some other supplier, which increases costs and leads to delays.

SUMMARY OF THE INVENTION

One aspect of the present invention provides a printed circuit board adapted for mounting different kinds of light sensing modules. The PCB comprises a light sensing area and a plurality of pads disposed around the light sensing area for electronically connecting one of the light sensing modules thereon.

Other advantages and novel features will become more apparent from the following detailed description of preferred embodiments when taken in conjunction with the accompanying drawings, in which:

DETAILED DESCRIPTION OF THE INVENTION

Figure 1:
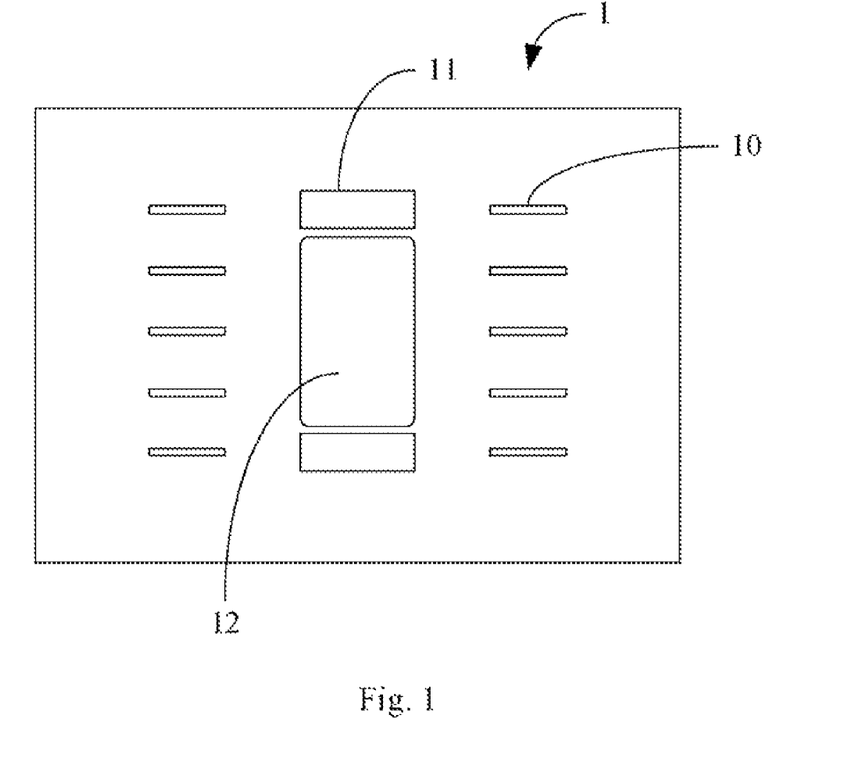
FIG. 1 is an illustrated view of a printed circuit board according to an exemplary embodiment of the present invention.

FIG. 1 is an illustrated view of a printed circuit board (PCB) 1 or a circuit substrate of an exemplary embodiment of the present invention. The PCB 1 comprises a sensing area 12 and a plurality of pads 10 and 11 distributed around the sensing area 12. The pads 10 and 11 are different kinds. In this embodiment, the pads 10 are disposed at two opposite sides of the light sensing area 12, the pads 11 are disposed at another two opposite sides of the light sensing area 12. The light sensing area 12 is a via in the PCB 1 for light going therethrough. In another embodiment, the light sensing area 12 may consist of a transparent object disposed over an opening in the PCB 1, such as a light guide, transparent glass, etc. In other words, the light sensing area 12 is a transparent area of the PCB 1.

Figure 2:
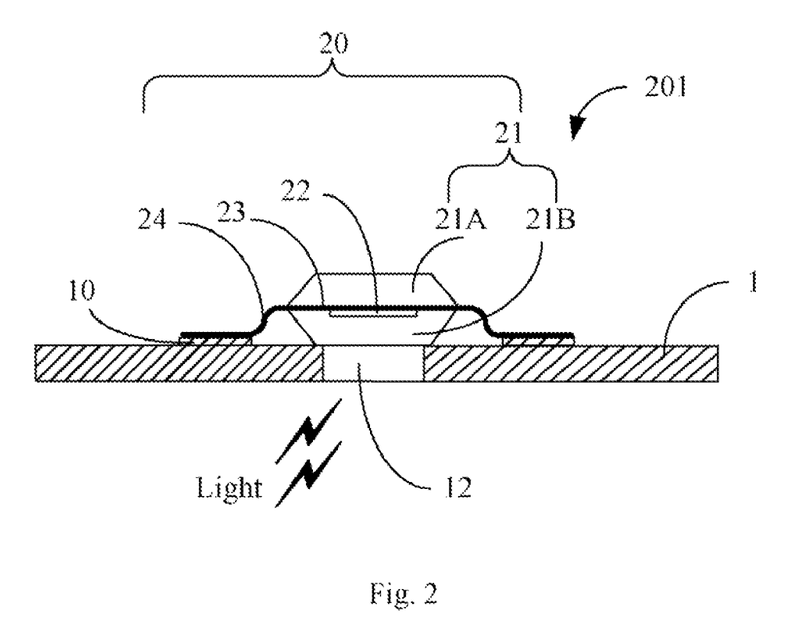
FIG. 2 is an illustrated side view of a light sensing device mounted on the printed circuit board of FIG. 1.
Figure 3:
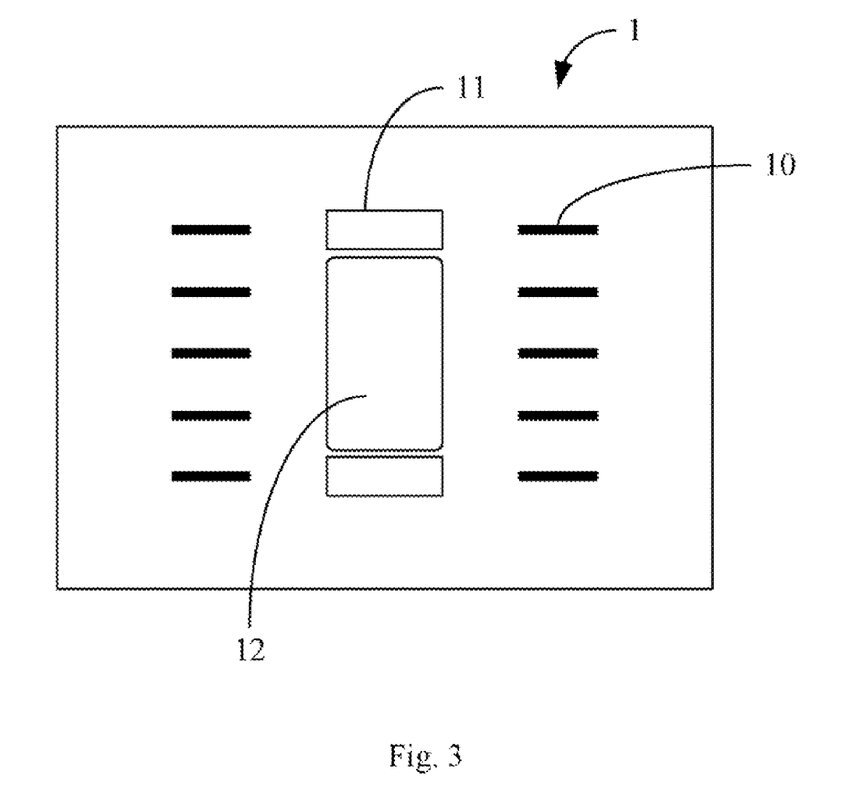
FIG. 3 is similar to FIG. 1 but with the footprint of the light sensing device of FIG. 2 indicated.

FIG. 2 shows a light sensing device 201 comprising a light sensing module 20 mounted on the PCB 1, and FIG. 3 indicates the footprint of the light sensing module 20 when being used on the PCB 1. In this exemplary embodiment, the light sensing module 20 is connected to the pads 10 on the PCB 1 to form the light sensing device 201.

In this embodiment, the light sensing module 20 is disposed over the light sensing area 12 or the via, and is electrically connected to the PCB 1 by way of the pads 10. Advantageously, the light sensing module 20 comprises a potting compound 21, a chip 22, a carrier board 23, and at least a pair of pins 24. In this embodiment, the number of the pins 24 is corresponding to that of the pads 10, the pins 24 are electrically connected to the corresponding pads 10. In other embodiment, parts of the pins 24 are used for electrically connecting to the corresponding pads 10, and remainders are used for fixing the light sensing module 20 to the PCB 1. The chip 22 is disposed on the carrier board 23, and is electrically connected to the PCB 1 by way of the pins 24.

The potting compound 21 comprises an upper potting compound 21A and a lower potting compound 21B, respectively symmetrically disposed on opposite faces of the carrier board 23. In this embodiment, the lower potting compound 21B encompasses the chip 22, holding it directly over the via 12 defined in the PCB 1. The potting compound 21 is transparent, thus the chip 22 can sense ambient light by way of the lower potting compound 21B and the via 12.

Figure 4:
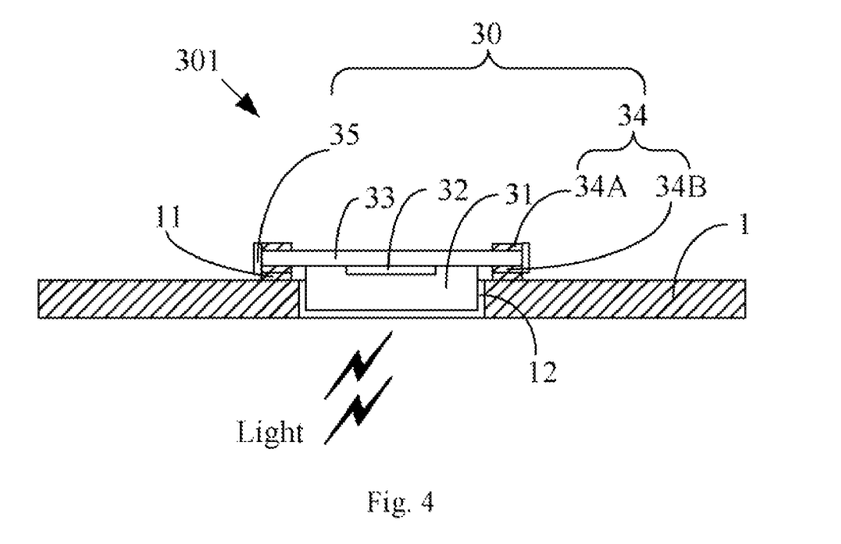
FIG. 4 is an illustrated side view of another light sensing module mounted on the printed circuit board of FIG. 1 in accordance with another exemplary embodiment of the present invention.
Figure 5:
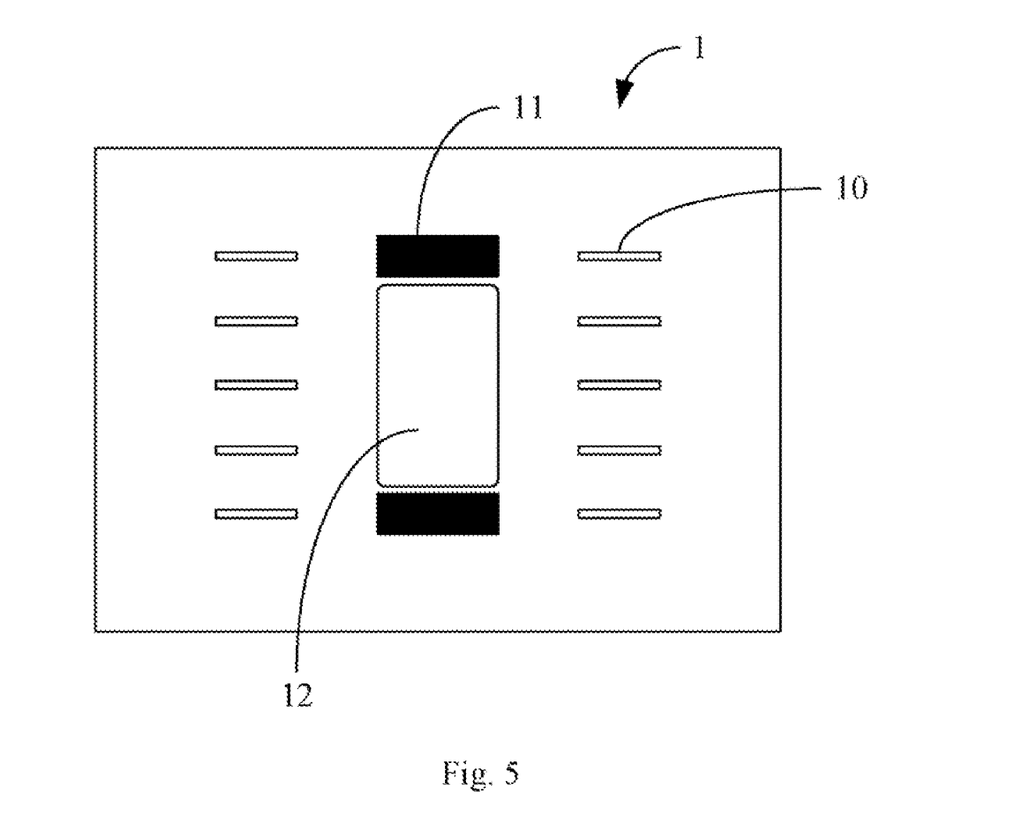
FIG. 5 is similar to FIG. 1 but with the footprint of the light sensing module of FIG. 4 indicated.

FIG. 4 shows another light sensing device 301 comprising a light sensing module 30 mounted on the PCB 1 in another embodiment of the present invention, and FIG. 5 indicates the footprint of the light sensing module 30 when being used on the PCB 1. In this exemplary embodiment, the pads 11 on the PCB 1 are applied to connect to the light sensing module 30 to form the light sensing device 301.

In this embodiment, the light sensing module 30 is disposed on the PCB 1 over the via 12, and is electrically connected to the PCB 1 by way of the pads 11. Advantageously, the light sensing module 30 comprises a potting compound 31, a chip 32, a carrier board 33, and at least one pair of pads 34. In this embodiment, the pads 34 comprise at least one pair of lower pads 34B mounted directly on the pads 11, and at least one pair of upper pads 34A mounted above the pads 34B and sandwiching the carrier board 33 therebetween. The upper pads 34A and the lower pads 34B are electrically connected by way of a conductor 35. The potting compound 31 packages the chip 32, and is configured to correspond to the via 12. In this embodiment, the potting compound 31 is transparent, and can be received in the via 12.

As described above, although the light sensing modules 20 and 30 are structurally different, the PCB 1 of the present invention is adapted to selectively mount either one thereon without changing the design thereof. In the embodiments, the via 12 should be suitable for the sizes of the light sensing modules 20 and 30, and meet light sensitivity requirements thereof.

Figure 6:
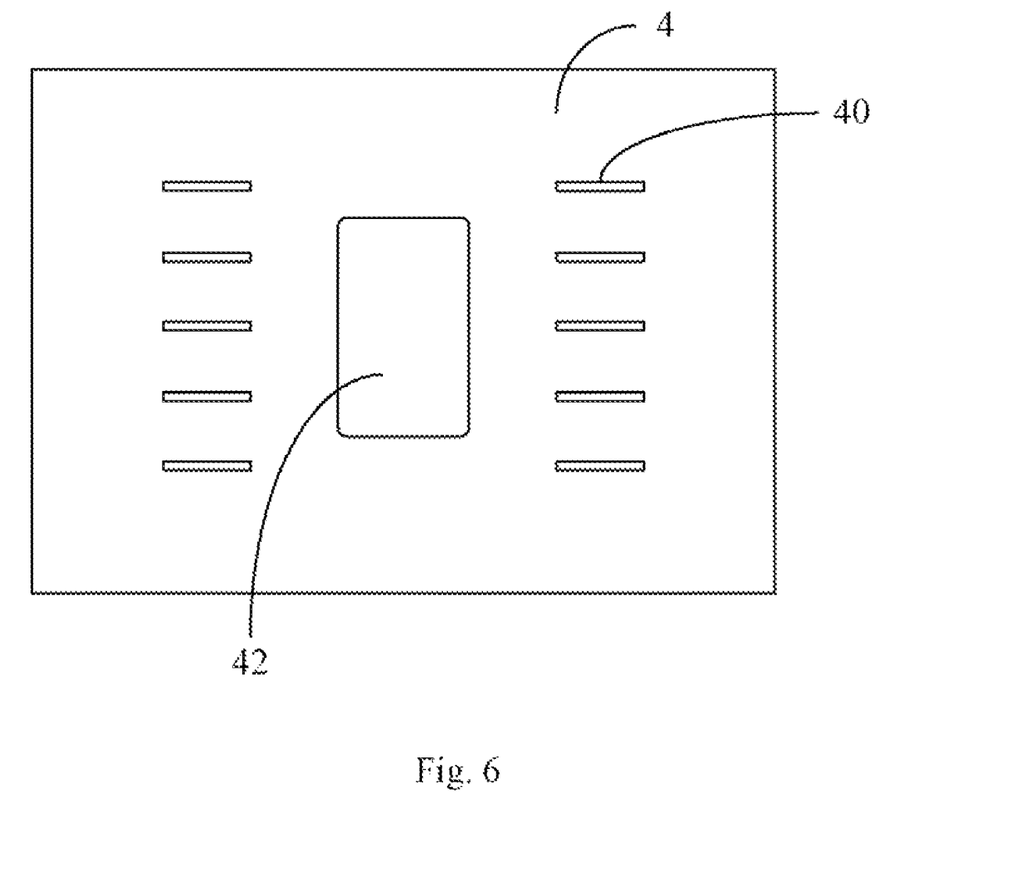
FIG. 6 is an illustrated view of a printed circuit board according to a further exemplary embodiment of the present invention.

FIG. 6 is an illustrated view of a PCB 4 according to a further exemplary embodiment of the present invention. The PCB 4 comprises a sensing area 42 and a plurality of pads 40 symmetrically disposed on two opposite sides of the light sensing area 42. The light sensing area 42 is a via or an opening defined in the PCB 4 for light passing therethrough. In another embodiment, the light sensing area 42 may consist of a transparent object disposed in the opening in the PCB 4, such as a light guide, transparent glass, etc.

Figure 7:
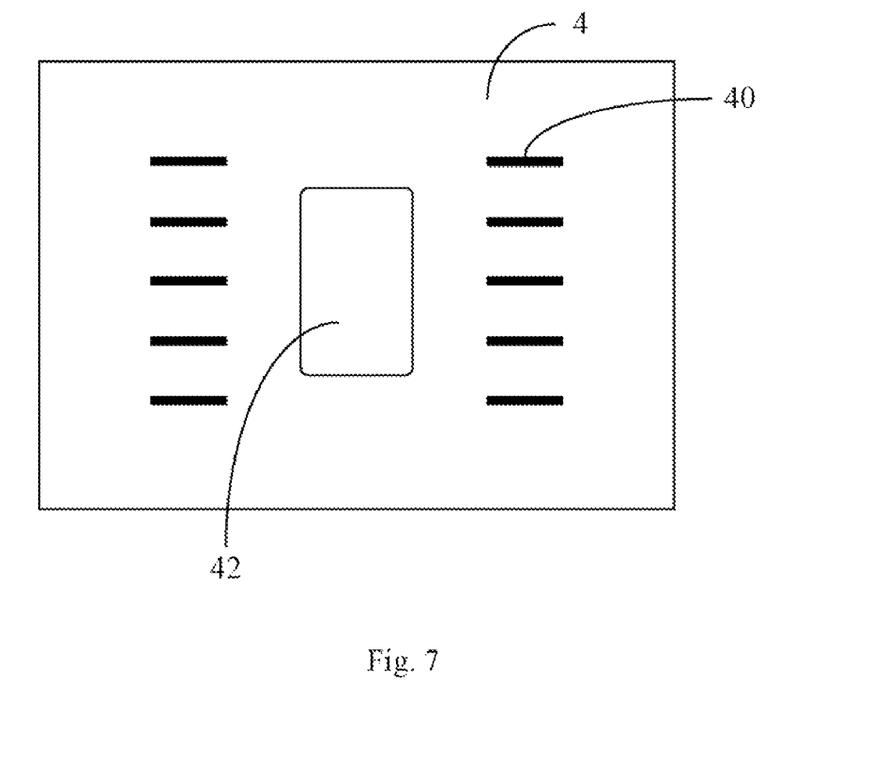
FIG. 7 is similar to FIG. 6 but showing the footprint of the light module of FIG. 2 with all of a plurality of pads on the printed circuit board used.

FIG. 7 shows the footprint of the light sensing module 20 when used on the PCB 4 of FIG. 6 and all the pads 40 are respectively connected to the pins 24.

Figure 8:
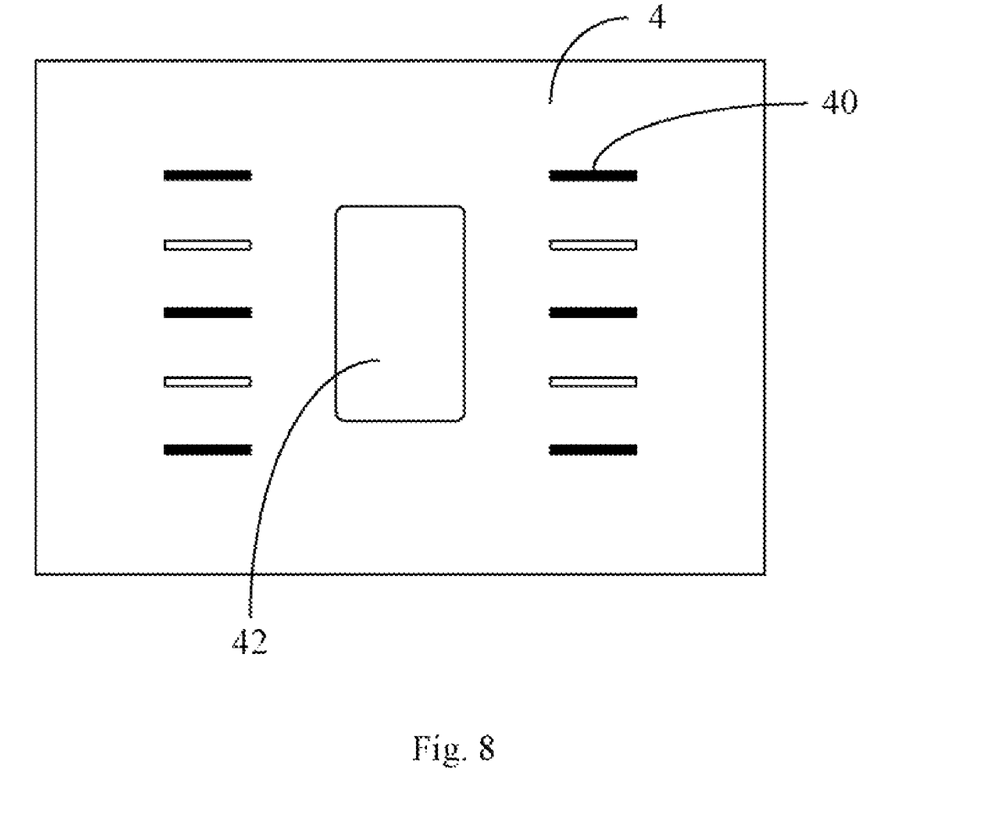
FIG. 8 is similar to FIG. 7 but showing a different footprint of the light module of FIG. 2 with only some of the plurality of pads on the printed circuit board used.

FIG. 8 shows the footprint of the light sensing module 20 applied to the PCB 4 when just some of the pins 24 are respectively connected to some of the pads 40 of the PCB 4.

In general, the PCB 1 of FIG. 1 and the PCB 4 of FIG. 6 are respectively adapted for connecting various light sensing modules thereon, depending on different practical requirements.

While embodiments and methods of the present invention have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A light sensing device, comprising:
a printed circuit board (PCB) adapted for mounting different kinds of light sensing modules, comprising:
a light sensing area; and
a plurality of pads comprising at least a first type and a second type of pads, the plurality of pads disposed around the light sensing area, for electronically connecting one of the light sensing modules thereon, wherein the first type of the pads are disposed at two opposite sides of the light sensing area, and the second type of the pads are disposed at another two opposite sides of the light sensing area;
wherein each of the different kinds of light sensing modules comprise:
a carrier board electronically connected to the PCB;
a potting compound disposed on one side of the carrier board;
a chip packaged in the potting compound and corresponding to the light sensing area of the PCB; and
at least one pair of pads each comprising an upper pad disposed on one side of the carrier board and a lower pad disposed on another side of the carrier board and electronically connected to one kind of the pads on the PCB.

2. The light sensing device as claimed in claim 1, wherein the light sensing area is a via defined in the PCB.

3. The light sensing device as claimed in claim 1, wherein the light sensing area is a transparent area of the PCB.

4. The light sensing device as claimed in claim 1, wherein the light sensing module comprises a conductor electronically connecting the upper pads to the lower pads.

5. A light sensing device comprising:
a light sensing module selected from one of a first kind of light sensing modules and a second kind of light sensing modules different from said first kind of light sensing modules; and
a circuit substrate for mounting said light sensing module thereon, said circuit substrate comprising a light sensing area therein for light to reach said mounted light sensing module on said circuit substrate within said light sensing area, at least one first pad formed along a first side of said light sensing area for electrically connecting with said first kind of light sensing modules, at least one second pad formed along a second side of said light sensing area neighboring said first side for electrically connecting with said second kind of light sensing modules;
wherein the light sensing module comprises:
a carrier board electronically connected to the circuit substrate;
a potting compound disposed on one side of the carrier board;
a chip packaged in the potting compound and corresponding to the light sensing area of the circuit substrate; and
at least one pair of pads each comprising an upper pad disposed on one side of the carrier board and a lower pad disposed on another side of the carrier board and electronically connected to one kind of the pads on the circuit substrate.

6. The light sensing device as claimed in claim 5, wherein said first side of said light sensing area is substantially perpendicular to said second side of said light sensing area.

7. The light sensing device as claimed in claim 5, wherein said light sensing area is a via to allow said light passing through said circuit substrate before said light reaches said mounted light sensing module on said circuit substrate.

8. The light sensing device as claimed in claim 5, wherein the first type and the second type of pads are according to the different sizes of the light sensing modules.

\* \* \* \* \*